(12) United States Patent
Reed et al.

(10) Patent No.: US 9,017,889 B2
(45) Date of Patent: *Apr. 28, 2015

(54) FRAME SEQUENCE FOR A CELL VOLTAGE MEASUREMENT SYSTEM WITH A LOW PROBABILITY OF NATURAL OCCURRENCE

(75) Inventors: David J. Reed, Fairport, NY (US);
Kenneth L. Kaye, Fairport, NY (US);
Derek R. Lebzelter, Fairport, NY (US);
Kevin Sampson, Rochester, NY (US)

(73) Assignee: GM Global Technology Operations LLC, Detroit, MI (US)

( * ) Notice: Subject to any disclaimer, the term of this patent is extended or adjusted under 35 U.S.C. 154(b) by 974 days.

This patent is subject to a terminal disclaimer.

(21) Appl. No.: 13/171,147

(22) Filed: Jun. 28, 2011

(65) Prior Publication Data

US 2013/0002232 A1    Jan. 3, 2013

(51) Int. Cl.
*H01M 8/04* (2006.01)
*H04Q 9/00* (2006.01)
*G01R 19/00* (2006.01)
*G01R 31/36* (2006.01)
*H01M 8/10* (2006.01)

(52) U.S. Cl.
CPC ...... *H01M 8/04992* (2013.01); *H01M 8/04873* (2013.01); *G01R 19/00* (2013.01); *H04Q 9/00* (2013.01); *G01R 31/362* (2013.01); *H01M 8/04552* (2013.01); *H01M 8/04671* (2013.01); *H01M 2008/1095* (2013.01); *Y02E 60/50* (2013.01); *H04Q 2209/845* (2013.01)

(58) Field of Classification Search
CPC ............... H01M 8/04544; H01M 8/04552; H01M 8/04865; H01M 5/04873; H01M 8/04992; H01M 8/04671
USPC ................................. 429/428–432
See application file for complete search history.

(56) References Cited

U.S. PATENT DOCUMENTS 7,768,800 B2 *   8/2010   Mazumder et al. ............. 363/17
2009/0305086 A1 * 12/2009   Lee et al. ....................... 429/12

FOREIGN PATENT DOCUMENTS

JP       2005085088 A   *   3/2005

OTHER PUBLICATIONS

Machine Translation of JP 2005-085088 A.*

* cited by examiner

*Primary Examiner* — Jonathan Jelsma
(74) *Attorney, Agent, or Firm* — John A. Miller; Miller IP Group, PLC

(57) ABSTRACT

A method for providing calibration and synchronization pulses in a pulse width modulation (PWM) signal including cell voltage measurement pulses, where the calibration pulses are four calibration pulses having a pattern of a narrow width high voltage pulse followed by a wide width low voltage pulse followed by a narrow width high voltage pulse followed by a wide width low voltage pulse that has a very low probability of occurring in a practical fuel cell system. The method modulates a combined sequence of the voltage measurement signals and the calibration pulses using an inverted saw tooth wave to provide the PWM signal, where a width of the pulses representing the voltage signals are proportional to a width of the pulses representing the calibration pulses.

19 Claims, 3 Drawing Sheets

FRAME SEQUENCE FOR A CELL VOLTAGE MEASUREMENT SYSTEM WITH A LOW PROBABILITY OF NATURAL OCCURRENCE

BACKGROUND OF THE INVENTION

1. Field of the Invention

This invention relates generally to a system and method for monitoring the cell voltages of fuel cells in a fuel cell stack and, more particularly, to a system and method for monitoring the cell voltages of fuel cells in a fuel cell stack that includes providing calibration pulses before cell voltage measurement pulses in a modulated cell voltage signal, where the calibration pulses have a start of frame sequence defined by a high voltage—a low voltage—a high voltage—a low voltage pattern that will not be reproduced by normal cell voltage measurements.

2. Discussion of the Related Art

Hydrogen is a very attractive fuel because it is clean and can be used to efficiently produce electricity in a fuel cell. A hydrogen fuel cell is an electro-chemical device that includes an anode and a cathode with an electrolyte therebetween. The anode receives hydrogen gas and the cathode receives oxygen or air. The hydrogen gas is dissociated in the anode to generate free protons and electrons. The protons pass through the electrolyte to the cathode. The protons react with the oxygen and the electrons in the cathode to generate water. The electrons from the anode cannot pass through the electrolyte, and thus are directed through a load to perform work before being sent to the cathode.

Proton exchange membrane fuel cells (PEMFC) are a popular fuel cell for vehicles. The PEMFC generally includes a solid polymer electrolyte proton conducting membrane, such as a perfluorosulfonic acid membrane. The anode and cathode typically include finely divided catalytic particles, usually platinum (Pt), supported on carbon particles and mixed with an ionomer. The catalytic mixture is deposited on opposing sides of the membrane. The combination of the anode catalytic mixture, the cathode catalytic mixture and the membrane define a membrane electrode assembly (MEA). MEAs are relatively expensive to manufacture and require certain conditions for effective operation.

Several fuel cells are typically combined in a fuel cell stack by serial coupling to generate the desired power. For example, a typical fuel cell stack for a vehicle may have two hundred or more stacked fuel cells. The fuel cell stack receives a cathode input reactant gas, typically a flow of air forced through the stack by a compressor. Not all of the oxygen is consumed by the stack and some of the air is output as a cathode exhaust gas that may include water as a stack by-product. The fuel cell stack also receives an anode hydrogen reactant gas that flows into the anode side of the stack. The stack also includes flow channels through which a cooling fluid flows.

The fuel cell stack includes a series of bipolar plates positioned between the several MEAs in the stack, where the bipolar plates and the MEAs are positioned between the two end plates. The bipolar plates include an anode side and a cathode side for adjacent fuel cells in the stack. Anode gas flow channels are provided on the anode side of the bipolar plates that allow the anode reactant gas to flow to the respective MEA. Cathode gas flow channels are provided on the cathode side of the bipolar plates that allow the cathode reactant gas to flow to the respective MEA. One end plate includes anode gas flow channels, and the other end plate includes cathode gas flow channels. The bipolar plates and end plates are made of a conductive material, such as stainless steel or a conductive composite. The end plates conduct the electricity generated by the fuel cells out of the stack. The bipolar plates also include flow channels through which a cooling fluid flows.

As a fuel cell stack ages, the performance of the individual cells in the stack degrade differently as a result of various factors. There are different causes of low performing cells, such as cell flooding, loss of catalyst, etc., some temporary and some permanent, some requiring maintenance, and some requiring stack replacement to exchange those low performing cells. Although the fuel cells are electrically coupled in series, the voltage of each cell when a load is coupled across the stack decreases differently where those cells that are low performing have lower voltages. Thus, it is necessary to monitor the cell voltages of the fuel cells in a stack to ensure that the voltages of the cells do not drop below a predetermined threshold voltage to prevent cell voltage polarity reversal, possibly causing permanent damage to the cell.

Typically, the voltage output of every fuel cell in a fuel cell stack is monitored so that the system knows if a fuel cell voltage is too low, indicating a possible failure. As is understood in the art, because all of the fuel cells are electrically coupled in series, if one fuel cell in the stack fails, then the entire stack will fail. Certain remedial actions can be taken for a failing fuel cell as a temporary solution until the fuel cell vehicle can be serviced, such as increasing the flow of hydrogen and/or increasing the cathode stoichiometry.

Fuel cell voltages are often measured by a cell voltage monitoring sub-system that includes an electrical connection to each bipolar plate, or some number of bipolar plates, in the stack and end plates of the stack to measure a voltage potential between the positive and negative sides of each cell. Therefore, a 400 cell stack may include 401 wires connected to the stack. Because of the size of the parts, the tolerances of the parts, the number of the parts, etc., it may be impractical to provide a physical connection to every bipolar plate in a stack with this many fuel cells, and the number of parts increases the cost and reduces the reliability of the system.

As discussed above, it is known in the art to process the voltages of the fuel cells in a fuel cell stack to determine whether the fuel cell stack is functioning as desired. Sometimes, cell voltage processing is performed every other cell because of the costs associated with monitoring every cell. Furthermore, it can be difficult to provide the necessary components in the space available to monitor every cell. In order to eliminate the need to connect fuel cell measurement circuits to a fuel cell stack using a plurality of interconnecting wires, it is desirable to embed such measurement circuits directly within the structure of the fuel cell stack assembly. Such an embedded measurement circuit would not add significant cost, and would allow for every fuel cell to be monitored.

U.S. patent application Ser. No. 12/840,047, titled Stack-Powered Fuel Cell Monitoring Device With Prioritized Arbitration, filed Jul. 20, 2010, assigned to the assignee of this application and herein incorporated by a reference, discloses a system and method for monitoring the cell voltages of fuel cells in a fuel cell stack. The system includes a plurality of voltage sensors coupled to the fuel cells in a fuel cell group, and a plurality of oscillators, where a separate oscillator is coupled to each of the sensors. Each oscillator operates at a different frequency, where higher frequency oscillators are coupled to lower priority sensors and lower frequency oscillators are coupled to higher priority sensors. The system also includes a light source, such as an LED, that receives frequency signals from the oscillators, where the light source switches on and off in response to the frequency signals and where lower frequency signals dominate the switching of the light source. A light pipe receives the switched light signals from the light source and provides light signals at a certain frequency at an end of the light pipe. A photodetector detects the light signals at the end of the light pipe.

The system disclosed in the '047 application for monitoring cell voltage has limitations in accurately providing the cell voltage, as do most other known cell voltage monitoring systems. As the fuel cell industry progresses, it is desirable to provide at least a 10-15 mV resolution accuracy of the voltages measured from the fuel cells. So far, this level of accuracy has been difficult to achieve using standard automotive sensors and parts. If the cell voltages are not accurately represented, then control of the various fuel cell system operations is limited in its accuracy, which could result in lower system performance, inefficiencies, cell degradation, etc. Further, prior cell voltage monitoring systems typically allowed the monitoring device to identify a minimum cell voltage, a maximum cell voltage and an average cell voltage, but were unable to identify which voltage was associated with which cell. It would be advantages to have this information so that a technician can identify a specific cell that may be failing.

SUMMARY OF THE INVENTION

In accordance with the teachings of the present invention, a system and method are disclosed for providing calibration and synchronization pulses in a pulse width modulation (PWM) signal including cell voltage measurement pulses, where the calibration pulses are four calibration pulses having a pattern of a narrow width high voltage pulse followed by a wide width low voltage pulse followed by a narrow width high voltage pulse followed by a wide width low voltage pulse that has a very low probability of occurring in a practical fuel cell system. The method includes providing a sequence of voltage signals representative of the voltage of the fuel cells in a fuel cell group, where the sequence of voltage signals are provided in the order of the position of the fuel cells in the group. The method also includes providing a sequence of calibration pulses and combining the sequence of voltage signals and the sequence of calibration pulses so that the calibration pulses are provided before a voltage signal of a first cell in the group. The method modulates the combined sequence of the voltage signals and the calibration pulses using an inverted saw tooth wave to provide the PWM signal, where a width of the pulses representing the voltage signals are proportional to a width of the pulses representing the calibration pulses.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for monitoring cell voltages in a fuel cell stack that provides a sequence of calibration pulses in a pulse width modulation (PWM) signal including cell voltage measurement pulses, where the calibration pulses have a pulse pattern of a high voltage—a low voltage—a high voltage—a low voltage, is merely exemplary in nature, and is in no way intended to limit the invention or its applications or uses.

Figure 1:
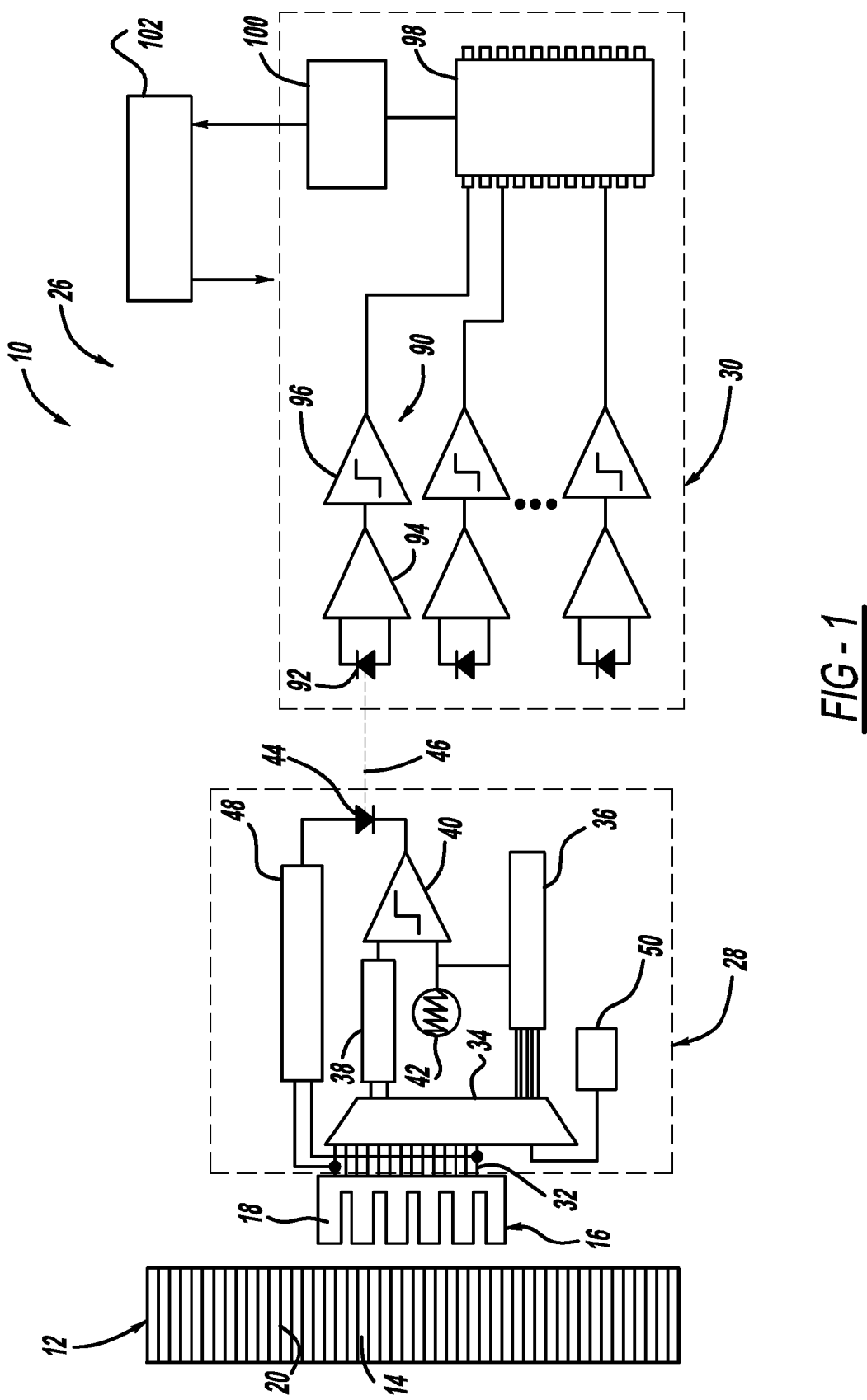
FIG. 1 is a schematic block diagram of a fuel cell system.

FIG. 1 is a schematic block diagram of a fuel cell system 10 including a fuel cell stack 12 having a plurality of stacked fuel cells 14. In this non-limiting embodiment, the fuel cell stack 12 includes groups of cells to build the fuel cell stack 12. The fuel cell system 10 also includes a stack interconnect 16 having a plurality of tabs 18 that are mounted in electrical contact with bipolar plates 20 that separate the fuel cells 14 in the fuel cell stack 12. In one non-limiting embodiment, the stack interconnect 16 includes seventeen of the tabs 18 to allow it to provide a voltage potential across sixteen of the fuel cells 14. Thus, to measure every one of the fuel cells 14 in the stack 12, the system 10 would include twenty of the stack interconnects 16, where a stack interconnect 16 is provided for each group of sixteen fuel cells 14 that is being monitored. In one embodiment, the stack interconnect 16 is an embedded interconnect that is part of the fuel cell stack 12, although other types of interconnects may be equally applicable. One example of an embedded interconnect suitable for this purpose can be found in U.S. patent application Ser. No. 12/707,572, filed Feb. 17, 2010, titled Plate Interconnect Method for an Embedded Fuel Cell Sensor, assigned to the assignee of this application and herein incorporated by reference.

The fuel cell system 10 also includes a cell voltage monitoring sub-system 26 including a cell voltage measuring circuit 28 and a receiver circuit 30. In the non-limiting embodiment being discussed herein, the cell voltage monitoring sub-system 26 would include cell voltage measuring circuits 28, one for each of the interconnects 16. A plurality of leads 32 extend from the circuit 28, where one of the leads 32 is electrically coupled to each tab 18 in the interconnect 16. An opposite end of each lead 32 is coupled to a multiplexer 34 that selectively provides two voltage potential signals from the interconnect tabs 18 to an instrumentation amplifier 38 at any given point in time, where one of the signals is a reference potential, to amplify the difference between the signals and provide the cell voltage measurement signal in the order that the cells 14 are positioned in the stack 12. A counter circuit 36 provides sequence signals to the multiplexer 34 to cause the multiplexer 34 to selectively and sequentially switch from one of the leads 32 to a next one of the leads 32. The output of the multiplexer 34 is amplified 38 such that the signal has a magnitude that identifies the voltage of the particular cell 14 being measured. The amplified cell voltage signal is provided to a comparator 40 that compares the signal to an inverted saw tooth wave provided by a saw tooth wave generator 42, where the output of the comparator 40 is a pulse width modulation (PWM) signal, and where the width of the pulses define the cell voltage, as will be discussed in detail below. The PWM signal is provided to an LED 44 that generates an optical signal 46 having an on/off time determined by the pulses. A power supply 48 provides a stable source of power to the interconnect 16 and the LED 44.

As is known in the art, the cell voltage measuring circuit 28 of the type being discussed sequentially measures the voltage of the cells 14 in order in the cell group and when the last cell voltage is measured, then the sequence returns to the first cell in the group to be measured and continues in this manner at the rate set by the saw tooth wave generator 42. The present invention provides a series of synchronization or calibration pulses that are introduced into the PWM signal after the last cell has been measured so that it provides an indication that the first cell in the group is now going to be measured again.

As mentioned, in order to improve the accuracy of the cell voltage measurements provided by the interconnect 16, the cell voltage monitoring circuit 28 provides a sequence of calibration or synchronization pulses in the PWM signal from the comparator 40 that allows the particular cell 14 being monitored to be identified and provides a calibration pulse width that identifies a voltage that the voltage measurements of the cells 14 are compared to. The width of the calibration pulses is chosen so that the magnitude of the voltage it represents, or pulse width, is outside of any possible voltage of the cells 14. In addition, providing pulses of a known magnitude, and in this example, symmetrical about a zero point, allows the system 10 to use the pulse width as a calibration value for the cell voltage measurement. If more than one pulse width of the same value is provided, the system 10 may choose to average the value of the calibration pulses, further reducing the measurement error. Providing the system calibration values allows significant variability in the component accuracy and variability in amount of light that is received at the receiver without introducing any measurement error.

Figure 2:
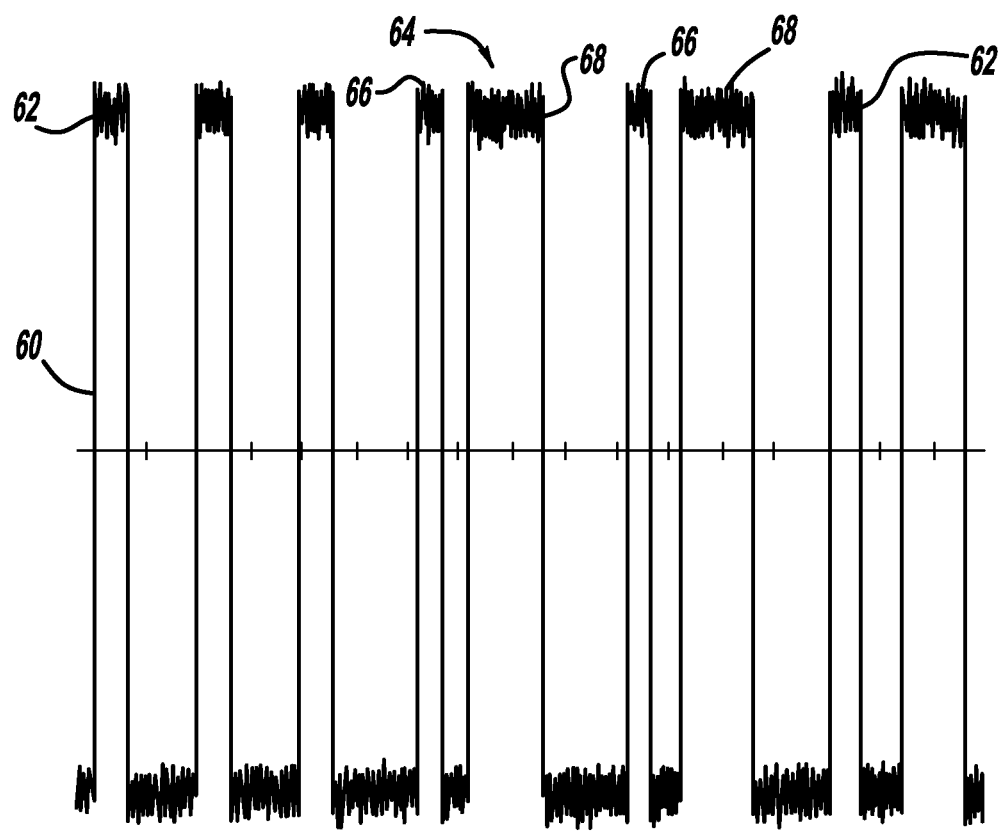
FIG. 2 is a graph with time on the horizontal axis and magnitude on the vertical axis showing a PWM signal that includes calibration pulses and cell voltage pulses.

FIG. 2 is a graph with time on the horizontal axis and amplitude on the vertical axis showing a PWM signal 60 of the type that is output from the comparator 40. The PWM signal 60 includes four synchronization pulses 64, where pulses 62 before the synchronization pulses 64 are cell voltage measurement pulses provided at the end of the group of the cells 14 and the pulses 62 after the synchronization pulses 64 are cell voltage measurement pulses provided at the beginning of the group of the cells 14. The pulses have been modulated by the saw tooth wave so that the width of the pulse defines the voltage of the particular cell 14. In this non-limiting embodiment, the synchronization pulses 64 include high voltage synchronization pulses 66 represented by a narrow pulse width and low voltage synchronization pulses 68 represented by a wide pulse width. The manner in which the high voltage has narrow pulses and the low voltage has wide pulses will be discussed below.

The synchronization pulses 64 provide a start of frame (SOF) reference pattern that when decoded provides an indication that the first cell 14 in the group of cells will be measured next. The format or pattern of the synchronization pulses 64 in this embodiment is a high pulse followed by a low pulse, followed by a high pulse and then followed by a low pulse (H-L-H-L). This pattern is specifically selected to provide a defined sequence of the synchronization pulses 64 that is very unlikely to occur in the actual voltage measurements of the cells 14, thus providing a good indication that the pulses are the synchronization pulses 64. The synchronization pulses 64 will always be four pulses in this embodiment, will always have the H-L-H-L pattern, and the pulse width of the pulses for the high pulses and the low pulses will always be the same. The pulse width of the pulses 62 is created by the actual voltage of the cell 14, as will be discussed in detail below.

As mentioned, the width of the synchronization pulses 64 is selected so that the voltage it represents is outside of the possible voltages that any of the cells 14 could have. In one non-limiting example, the width of the high voltage pulses 66 represents 1.235V and the width of the low voltage pulses 68 represents −1.235V. The width of the calibration pulses 64 provides a calibration voltage that the actual cell voltage measurement pulses can be compared to, where the proportionality of the width between the pulses identifies the actual voltage. By providing a calibration pulse that the other pulses are relative to, the actual cell voltage measurement is not based on an absolute voltage measurement, which allows for less expensive components and data processing. As will be discussed in detail below, the modulation provided by the saw tooth wave creates the PWM signal 60 so that the high voltage has a narrow pulse width and the low voltage has a wide pulse width.

Figure 3:
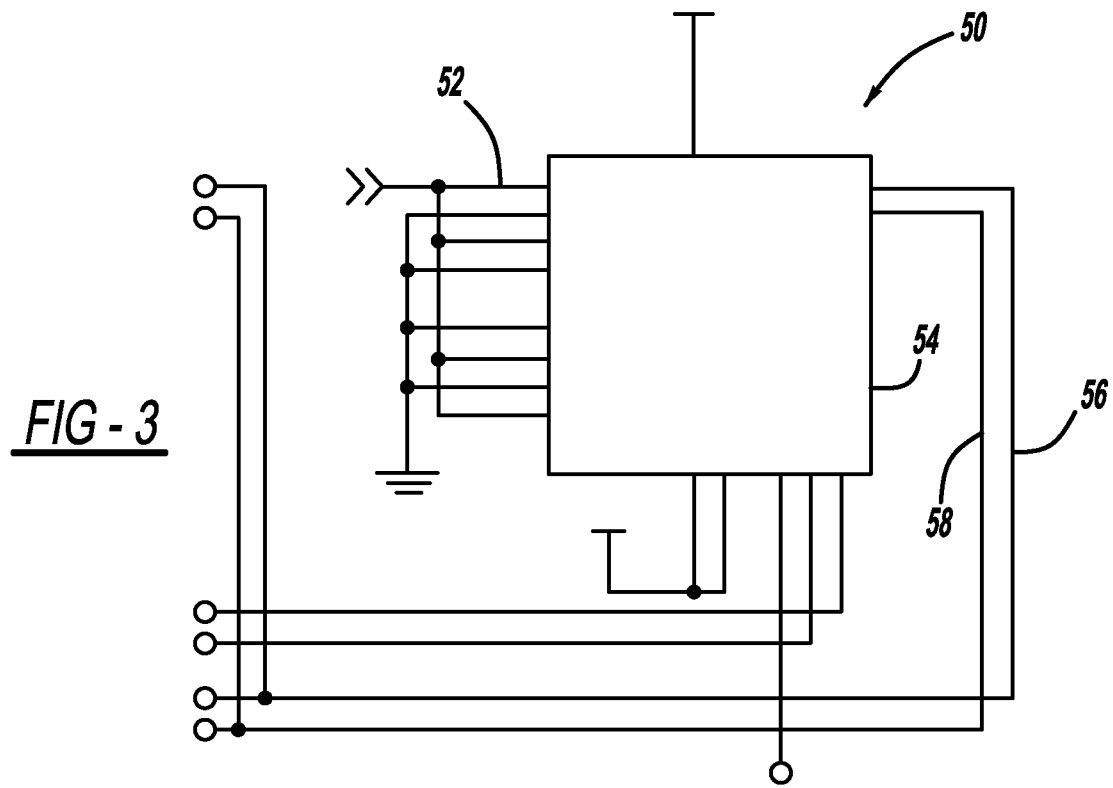
FIG. 3 is a schematic block diagram of a circuit for providing the reference pulses.

The calibration pulses 64 can be injected into the PWM signal 60 in any suitable matter. In the system 10, a reference circuit 50 is provided that generates the sequenced values that become the modulated calibration pulses 64. The counter circuit 36 sequences the signals from the reference circuit 50 into the measurement stream after the last cell 14 in the group is measured. FIG. 3 is a schematic block diagram of the reference circuit 50. A calibration voltage $V_{cal}$, 1.235 V in this non-limiting example, is provided to a series of pins on line 52 to a multiplexer which presents the voltage values in sequence to the amplifier 38 and then to the comparator 40. The distinguishment between the high and low calibration pulses is provided by the modulation using the inverted saw tooth wave.

The calibration pulses 64 allow the voltage measurements to be calibrated, in this example, 250 times per second. In other words, the amount of time that the pulse is high is compared to the high voltage calibration pulse 66 to give the voltage measurement that will be less than that value. Because the sequence of the pulses 64 represents a start for the next measurement of the fuel cells 14, and those measurements are taken in the order of the cells 14 in the stack 12, each pulse specifically identifies which cell 14 in the group of cells being monitored is associated with that pulse.

Figure 4:
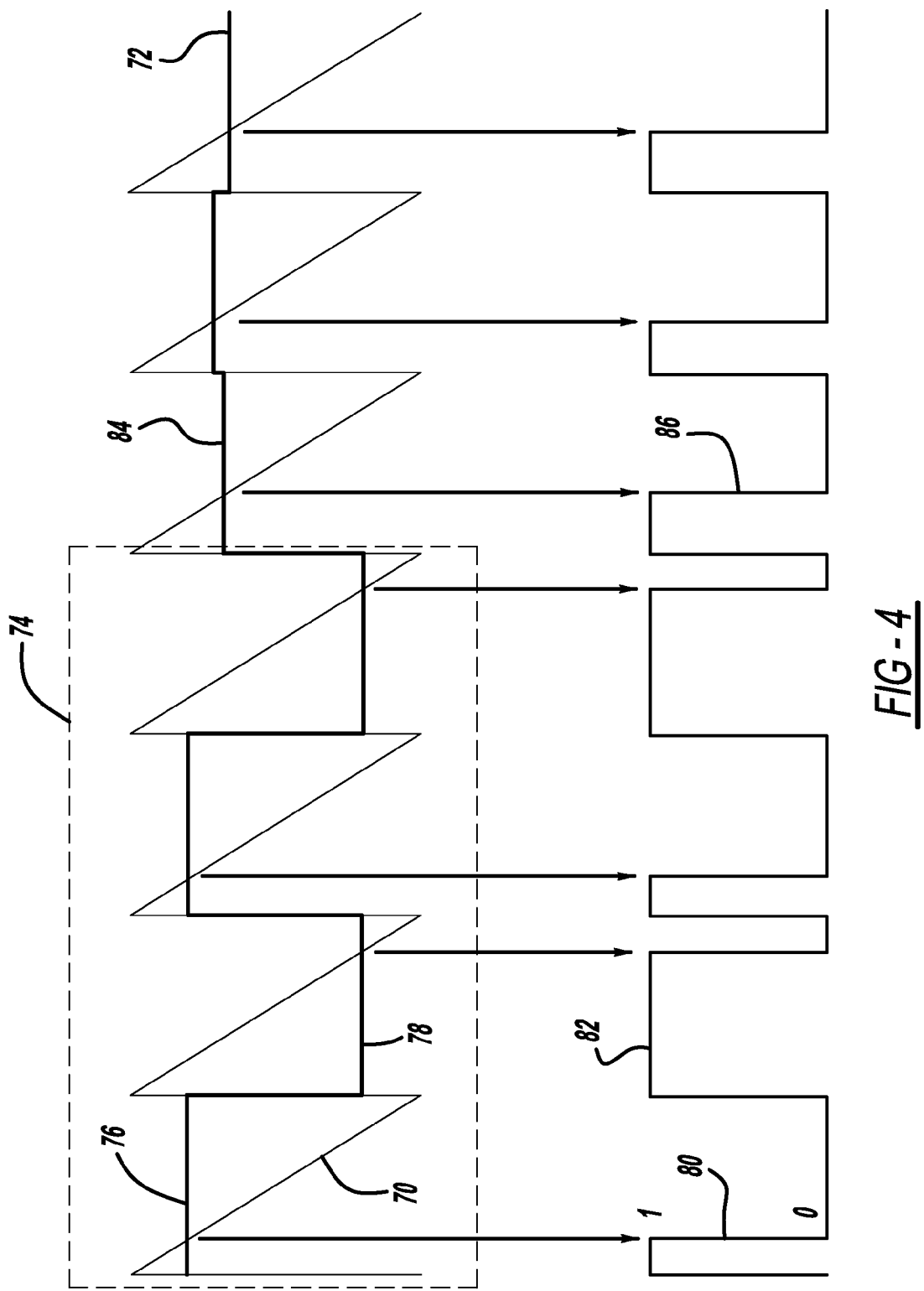
FIG. 4 is a graph with time on the horizontal axis and magnitude on the vertical axis showing a comparison between a cell voltage measurement signal including calibration pulses, a saw tooth comparison signal and an LED output signal.

FIG. 4 is graph with time on the horizontal axis and magnitude on the vertical axis showing a relationship between the inputs to the comparator 40 to provide the modulation of the cell voltage measurement signals and the optical signal 46 that is output from the LED 44. At the top of FIG. 4, a saw tooth wave 70 from the saw tooth generator 42 is shown super-imposed over a voltage signal 72 from the instrumentation amplifier 38. Section 74 of the signal 72 includes four square wave pulses provided by the reference circuit 50 that when modulated by the saw tooth wave 70 provides the H-L-H-L pulse sequence shown in FIG. 2 for the high voltage pulses 66 and the low voltage pulses 68. The positive portion 76 of the square wave pulses will become the narrow width high voltage calibration pulses 66 and the negative portion 78 of the square wave pulses will become the wide width low voltage calibration pulses 68.

If the saw tooth wave 70 is greater in magnitude than the signal 72, then the comparator 40 outputs a high signal, which causes the LED 44 to conduct and generate the optical signal 46. This is shown by the bottom of the graph where 1 represents the LED 44 being on and 0 represents the LED 44 being off. Particularly, optical pulses 80 represent the high voltage calibration pulses 66, optical pulses 82 represent the low voltage calibration pulses 68 and optical pulses 86 represent the voltage measurement pulses, where sections 84 in the signal 72 represent the voltage measurement of the particular cell 14 being measured. As is apparent, it is the angle provided by the inverted saw tooth wave 70 that creates the modulation for the width of the pulse being relative to the magnitude of the voltage measurement signal. Therefore, the LED pulses are narrower for the high voltage than they are for the low voltage in the calibration startup frame sequence. Particularly, as the magnitude of the pulse 84 goes up, it is covered by a narrower part of the saw tooth wave 70, which creates a narrower pulse in the LED signal. Thus, the greater the magnitude of the sections 84 represented by a higher voltage of the particular cell 14 being measured, the narrower the pulse for that voltage measurement, which represents a higher voltage.

The receiver circuit 30 includes a series of receiver channels 90, where there is a single channel 90 for each of the twenty cell voltage measuring circuit 28. Each channel 90 includes a photodiode 92 that receives the optical signal 46 and a trans-impedance amplifier 94 that converts the diode current to a representative voltage. The voltage signal from the amplifier 94 is then sent to a comparator 96 to make sure it is within a desired range, and if so, is then sent to a master CPU 98, which receives the signals from all of the channels 90. The CPU 98 decodes the on/off sequence of the voltage signal to identify the calibration pulses 64 so that each new group of actual voltage measurement signals are recalibrated to the startup calibration sequence at each measurement. The CPU 98 uses the width of the voltage pulses that have been decoded to identify a minimum cell voltage, a maximum cell voltage, an average cell voltage, and the actual voltage of each cell. This information is provided to a dual CAN 100 that provides the information to a vehicle bus through a serial interface circuit (SIU) 102 and then to a vehicle ECU (not shown) that controls the fuel cell system 10, such as controlling reactant flow rates, stack relative humidity, etc. The edge-to-edge time of the PWM signal 60 does not exceed the capability of the timer capture unit in the CPU 98.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for monitoring voltages of fuel cells in a fuel cell group, said method comprising:
   providing a sequence of voltage signals representative of the voltages of the fuel cells in the group, where the sequence of voltage signals are provided in order of the position of the fuel cells in the group;
   providing a sequence of synchronization and calibration pulses that define a predetermined voltage;
   combining the sequence of voltage signals and the sequence of calibration pulses so that the calibration pulses are provided before a voltage signal of a first cell in the group; and
   modulating the combined sequence of the voltage signals and the calibration pulses to provide a pulse width modulation (PWM) signal where a width of pulses representing the voltage signals in the PWM signal is proportional to a width of pulses representing the calibration pulses in the PWM signal, and where the modulated calibration pulses are four calibration pulses having a pattern of a narrow width high voltage pulse followed by a wide width low voltage pulse followed by a narrow width high voltage pulse followed by a wide width low voltage pulse.

2. The method according to claim 1 wherein providing a sequence of calibration pulses includes providing calibration pulses having a pulse width defining a representative voltage that is either greater than a highest possible voltage of the fuel cells or is less than a lowest possible voltage of the fuel cells.

3. The method according to claim 2 wherein the representative voltage of the calibration pulses greater than the highest possible voltage of the fuel cells is about 1.235 V and the representative voltage of the calibration pulses less than the lowest possible voltage of the fuel cells is about −1.235 V.

4. The method according to claim 1 wherein combining the sequence of voltage signals and the sequence of calibration pulses includes providing the voltage signals and the calibration pulses to a multiplexer.

5. The method according to claim 1 wherein modulating the combined sequence of the voltage signals and the calibration pulses includes modulating the combined sequence using a saw tooth wave.

6. The method according to claim 5 wherein modulating the combined sequence with a saw tooth wave includes causing higher voltage pulses to have a narrower width in the PWM signal than lower voltage pulses.

7. The method according to claim 1 wherein providing a sequence of calibration pulses includes providing a square wave signal.

8. The method according to claim 1 further comprising converting the modulated and combined sequence of voltage signals and the calibration pulses to an optical signal.

9. A method for monitoring voltages of fuel cells in a fuel cell group, said method comprising:
   providing a sequence of voltage measurement signals representative of the voltages of the fuel cells in the group;
   providing a sequence of calibration pulses; and
   modulating the sequence of the voltage measurement signals and the calibration pulses to provide a pulse width modulation (PWM) signal where the modulated calibration pulses are four calibration pulses having a pattern of a narrow width pulse followed by a wide width pulse followed by a narrow width pulse followed by a wide width pulse.

10. The method according to claim 9 wherein providing a sequence of calibration pulses includes providing calibration pulses having a pulse width defining a representative voltage that is either greater than a highest possible voltage of the fuel cells or is less than a lowest possible voltage of the fuel cells.

11. The method according to claim 9 wherein modulating the combined sequence of the voltage signals and the calibration pulses includes modulating the combined sequence using a saw tooth wave.

12. The method according to claim 9 wherein providing a sequence of calibration pulses includes providing a square wave signal.

13. A system for monitoring voltages of fuel cells in a fuel cell group, said system comprising:
   means for providing a sequence of voltage signals that represent the voltages of the fuel cells in the group, where the sequence of voltage signals are provided in order of the position of the fuel cells in the group;
   means for providing a sequence of synchronization and calibration pulses that define a predetermined voltage;
   means for combining the sequence of voltage signals and the sequence of calibration pulses so that the calibration pulses are provided before a voltage signal of a first cell in the group; and
   means for modulating the combined sequence of the voltage signals and the calibration pulses to provide a pulse width modulation (PWM) signal where a width of pulses representing the voltage signals in the PWM signal is proportional to a width of pulses representing the calibration pulses in the PWM signal, and where the modulated calibration pulses are four calibration pulses having a pattern of a narrow width high voltage pulse followed by a wide width low voltage pulse followed by a narrow width high voltage pulse followed by a wide width low voltage pulse.

14. The system according to claim 13 wherein the means for providing a sequence of calibration pulses provides calibration pulses having a pulse width defining a representative voltage that is either greater than a highest possible voltage of the fuel cells or is less than a lowest possible voltage of the fuel cells.

15. The system according to claim 13 wherein the means for combining the sequence of voltage signals and the sequence of calibration pulses provides the voltage signals and the calibration pulses to a multiplexer.

16. The system according to claim 13 wherein the means for modulating the combined sequence of the voltage signals and the calibration pulses modulates the combined sequence using a saw tooth wave.

17. The system according to claim 16 wherein the means for modulating the combined sequence using a saw tooth wave causes higher voltage pulses to have a narrower width in the PWM signal than lower voltage pulses.

18. The system according to claim 13 wherein the means for providing a sequence of calibration pulses provides a pulse sequence signal.

19. The system according to claim 13 further comprising means for converting the modulated and combined sequence of voltage signals and the calibration pulses to an optical signal.

\* \* \* \* \*